(12) United States Patent
Feng et al.

(10) Patent No.: US 11,038,478 B2
(45) Date of Patent: Jun. 15, 2021

(54) RADIO FREQUENCY SIGNAL TRANSCEIVER

(71) Applicant: Montage LZ Technologies (Chengdu) Co., Ltd., Chengdu (CN)

(72) Inventors: Shen Feng, Chengdu (CN); Xinwu Cai, Chengdu (CN); Shunfang Wu, Chengdu (CN); Jun Xu, Chengdu (CN); Mingfu Shi, Chengdu (CN); Taibo Dong, Chengdu (CN)

(73) Assignee: Montage LZ Technologies (Chengdu) Co., Ltd., Chengdu (CN)

( * ) Notice: Subject to any disclaimer, the term of this patent is extended or adjusted under 35 U.S.C. 154(b) by 0 days.

(21) Appl. No.: 15/931,552

(22) Filed: May 13, 2020

(65) Prior Publication Data

US 2021/0152138 A1   May 20, 2021

(30) Foreign Application Priority Data

Nov. 19, 2019   (CN) .......................... 201911130477.0

(51) Int. Cl.
*H03F 3/195* (2006.01)
*H03F 3/24* (2006.01)
*H03F 3/21* (2006.01)
*H04B 1/44* (2006.01)

(52) U.S. Cl.
CPC ............. *H03F 3/195* (2013.01); *H03F 3/211* (2013.01); *H03F 3/245* (2013.01); *H04B 1/44* (2013.01); *H03F 2200/294* (2013.01); *H03F 2200/451* (2013.01); *H03F 2200/537* (2013.01); *H03F 2200/541* (2013.01)

(58) Field of Classification Search
CPC .......... H03F 3/195; H03F 3/211; H03F 3/245; H03F 2200/294; H03F 2200/451; H03F 2200/537; H03F 2200/541; H04B 1/44; H04B 1/40
See application file for complete search history.

(56) References Cited

U.S. PATENT DOCUMENTS

| | | | | |
|---|---|---|---|---|
| 8,380,153 B2* | 2/2013 | Roufoogaran | ........... | H04B 1/48 455/292 |
| 9,793,942 B1* | 10/2017 | Lakkis | ................ | H03F 3/45071 |
| 2003/0137383 A1* | 7/2003 | Yang | ................... | H01F 17/0013 336/200 |

(Continued)

*Primary Examiner* — Nguyen T Vo
(74) *Attorney, Agent, or Firm* — JCIP Global Inc.

(57) ABSTRACT

A radio frequency (RF) signal transceiver is provided. The RF signal transceiver includes a first transformer, a signal transceiving processor, a signal receiving amplifier, and a signal transmitting amplifier. The first transformer is coupled to an antenna through a first end of a primary side, and two endpoints of a secondary side of the first transformer receive and transmit a pair of differential signals. The signal transceiving processor receives a pair of input differential signals from the secondary side of the first transformer and generates a pair of processed differential signals. The signal receiving amplifier is coupled to the signal transceiving processor and is configured to receive and amplify the pair of processed differential signals. The signal transmitting amplifier is coupled to the secondary side of the first transformer and provides a pair of transmission differential signals to the secondary side.

10 Claims, 2 Drawing Sheets

(56) References Cited

U.S. PATENT DOCUMENTS

| | | | |
|---|---|---|---|
| 2007/0152904 A1* | 7/2007 | Castaneda | H03F 3/45179 343/859 |
| 2007/0207746 A1* | 9/2007 | Huang | H04B 1/18 455/78 |
| 2008/0231535 A1* | 9/2008 | Rofougaran | H03F 3/245 343/850 |
| 2013/0009704 A1* | 1/2013 | Liao | H03F 3/45183 330/253 |

* cited by examiner

RADIO FREQUENCY SIGNAL TRANSCEIVER

CROSS-REFERENCE TO RELATED APPLICATION

This application claims the priority benefit of China application serial no. 201911130477.0, filed on Nov. 19, 2019. The entirety of the above-mentioned patent application is hereby incorporated by reference herein and made a part of this specification.

BACKGROUND

Technical Field

The disclosure relates to a radio frequency signal transceiver, and in particular, relates to a radio frequency signal transceiver exhibiting improved signal receiving and transmitting quality, enhanced noise interference resistance, and lowered circuit costs.

Description of Related Art

In the related art, a radio frequency (RF) signal transceiver is formed by a receiver and a transmitter. The RF signal transceiver may operate in a signal receiving mode as well as a signal transmitting mode. The receiver may down-convert an RF signal received by an antenna to a baseband signal, and the transmitter may up-convert the baseband signal to a transmitting signal and transmit it through the antenna. Moreover, in the related art, the RF signal transceiver is configured to process a single-ended signal. As such, unfavorable signal receiving and transmitting quality and poor noise interference resistance are provided.

In addition, a transmission mode switching switch is required to be disposed in the RF signal transceiver so as to allow the RF signal transceiver to operate in both the signal receiving mode and the signal transmitting mode. Nevertheless, in the related art, a transmission mode switching switch of a large size is required to be disposed on the transmitter of the RF signal transceiver. Moreover, as affected by insertion loss introduced by the transmission mode switching switch, transmitting power is lowered or significant current consumption is caused, die size and circuit costs are increased as well.

SUMMARY

The disclosure provides a radio frequency (RF) signal transceiver exhibiting improved signal receiving and transmitting quality, enhanced noise interference resistance, and lowered circuit costs.

An embodiment of the disclosure provides an RF signal transceiver including a first transformer, a signal transceiving processor, a signal receiving amplifier, and a signal transmitting amplifier. The first transformer is coupled to an antenna through a first end of a primary side, two endpoints of a secondary side of the first transformer receive and transmit a pair of differential signals. The signal transceiving processor receives a pair of input differential signals from the secondary side of the first transformer and generates a pair of processed differential signals. The signal receiving amplifier is coupled to the signal transceiving processor and is configured to receive and amplify the pair of processed differential signals. The signal transmitting amplifier is coupled to the secondary side of the first transformer and provides a pair of transmission differential signals to the secondary side of the first transformer.

In an RF signal transceiver according to an embodiment of the disclosure, the signal transceiving processor is configured to execute a match operation of an input frequency band of the signal receiving amplifier and a match operation of an output frequency band of the signal transmitting amplifier.

In an RF signal transceiver according to an embodiment of the disclosure, a signal transceiving processor includes a transmission mode switching switch. The transmission mode switching switch is coupled to two transmission endpoints transmitting the pair of processed differential signals. The transmission mode switching switch sets the two transmission endpoints to be short-circuited to a reference voltage end in a signal transmitting mode, and the transmission mode switching switch sets the two transmission endpoints to be disconnected to the reference voltage end in a signal receiving mode.

In an RF signal transceiver according to an embodiment of the disclosure, a signal transceiving processor includes a pair of direct current (DC) decoupling capacitors and a capacitor inductor circuit. The pair of DC decoupling capacitors is respectively coupled to the two endpoints of the secondary side of the first transformer. The capacitor inductor circuit is coupled to the pair of DC decoupling capacitors, receives the pair of input differential signals through the pair of DC decoupling capacitors, and generates the pair of processed differential signals.

In an RF signal transceiver according to an embodiment of the disclosure, a capacitor inductor circuit includes a first capacitor, a first inductor, a second inductor, and a second capacitor. The first capacitor is coupled between a pair of DC decoupling capacitors. The first inductor has a first end coupled to a first end of the first capacitor. The second inductor has a first end coupled to a second end of the first capacitor. The second capacitor is coupled between a second end of the first inductor and a second end of the second inductor. Herein, the second end of the first inductor and the second end of the second inductor provide the pair of processed differential signals.

In an RF signal transceiver according to an embodiment of the disclosure, the first capacitor and the second capacitor are variable capacitors, and the first inductor and the second inductor are variable inductors.

In an RF signal transceiver according to an embodiment of the disclosure, the first inductor and the second inductor form a second transformer.

In an RF signal transceiver according to an embodiment of the disclosure, the capacitor inductor circuit is configured to execute a match operation of an input frequency band of the signal receiving amplifier and a match operation of an output frequency band of the signal transmitting amplifier.

In an RF signal transceiver according to an embodiment of the disclosure, a second end of the primary side of the first transformer is coupled to a reference ground end.

In an RF signal transceiver according to an embodiment of the disclosure, the first end and a second end of the primary side of the first transformer receive and transmit the pair of differential signals from the antenna, and a central tap end of the primary side of the first transformer is coupled to a reference ground end.

To sum up, in the disclosure, the first transformer is provided at the connection port between the RF signal transceiver and the antenna. In this way, the RF signal transceiver is a fully differential structure and is configured to process the pair of differential signals. Therefore, favorable impedance matching is provided, efficiency of power use is increased, signal receiving and transmitting quality is improved, and noise interference resistance is enhanced.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1:
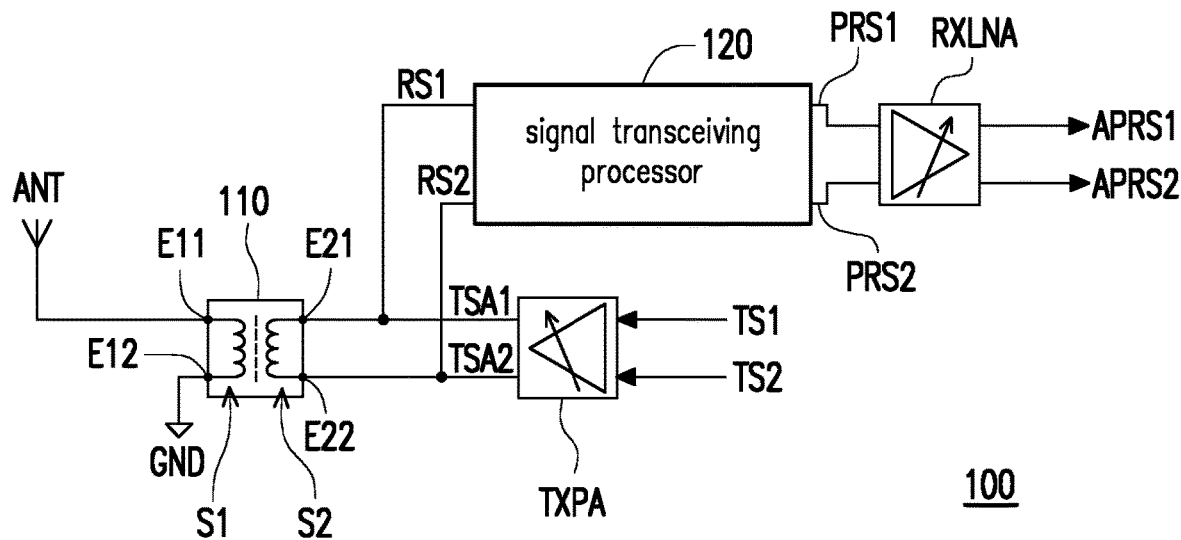
FIG. 1 is a schematic diagram illustrating a radio frequency (RF) signal transceiver according to an embodiment of the disclosure.

Descriptions of the disclosure are given with reference to the exemplary embodiments illustrated by the accompanying drawings. Wherever possible, the same reference numbers are used in the drawings and the description to refer to the same or like parts.

Referring to FIG. 1, FIG. 1 is a schematic diagram illustrating a radio frequency (RF) signal transceiver according to an embodiment of the disclosure. An RF signal transceiver 100 includes a transformer 110, a signal transceiving processor 120, a signal receiving amplifier RXLNA, and a signal transmitting amplifier TXPA. A first end E11 of a primary side S1 of the transformer 110 is coupled to an antenna ANT. Two endpoints E21 and E22 of a secondary side S2 of the transformer 110 receive and transmit a pair of differential signals. An input end of the signal transceiving processor 120 is coupled to the secondary side S2 of the transformer 110 and is configured to receive a pair of input differential signals RS1 and RS2 and outputs a pair of processed differential signals PRS1 and PRS2 through the secondary side S2. The signal receiving amplifier RXLNA is coupled to an output end of the signal transceiving processor 120 and is configured to receive and amplify the pair of processed differential signals PRS1 and PRS2 and to generate a pair of amplified differential signals APRS1 and APRS2. The signal transmitting amplifier TXPA is coupled to the secondary side S2 of the transformer 110 as well. The signal transmitting amplifier TXPA amplifies a pair of received differential signals TS1 and TS2 and provides a pair of amplified differential signals TSA1 and TSA2 to the secondary side S2 of the transformer 110.

In this embodiment, the transformer 110 acts as a conversion port between a single-ended signal and a pair of differential signals. In a signal receiving mode, the transformer 110 receives a single-ended signal from the antenna ANT through the first end E11 of the primary side S1 and generates the pair of input differential signals RS1 and RS2 at the secondary side S2 according to the single-ended signal on the antenna ANT. In contrast, in a signal transmitting mode, the transformer 110 receives a pair of transmission differential signals TSA1 and TSA2 from the signal transmitting amplifier TXPA through the first end E21 and the second end E22 of the secondary side S2, converts the pair of transmission differential signals TSA1 and TSA2 into a single-ended signal, and transmits the single-ended signal to the antenna ANT through the first end E11 of the primary side S1 of the transformer 110. In this embodiment, the second end E12 of the primary side S1 of the transformer 110 is coupled to a reference ground end GND.

Moreover, in the signal transmitting mode, the primary side S1 of the transformer 110 provides impedance (e.g., 50 ohm) required by the antenna ANT for matching, and the secondary side S2 of the transformer 110 provides low impedance. Through impedance conversion performed by the transformer 110, impedance matching of a circuit assembly in a printed circuit board of the antenna ANT end and filtering function of a harmonic are provided; moreover, impedance on an output end of the signal transmitting amplifier TXPA is lowered, and power usage efficiency is increased. Note that the signal transceiving processor 120 is configured to execute a match operation of an output frequency band of the signal transmitting amplifier TXPA.

On the other hand, in the signal receiving mode, the signal transceiving processor 120 receives the pair of input differential signals RS1 and RS2 and performs signal processing on the pair of input differential signals RS1 and RS2 to generate the pair of processed differential signals PRS1 and PRS2. The pair of processed differential signals PRS1 and PRS2 may be provided to the signal receiving amplifier RXLNA, and the pair of amplified differential signals APRS1 and APRS2 are generated through the signal receiving amplifier RXLNA. Note that the signal transceiving processor 120 is configured to execute the match operation of an input frequency band of the signal receiving amplifier RXLNA.

Note that through the transformer, the RF signal transceiver 100 of the disclosure is implemented as a fully differential structure. As such, a power source voltage level required by a circuit assembly in the RF signal transceiver 100 is lowered, and power consumption is thereby reduced. Moreover, when the pair of differential signals is adopted, signal receiving and transmitting quality is improved, noise interference resistance is enhanced, and operating efficiency of the RF signal transceiver 100 is also increased.

Figure 2:
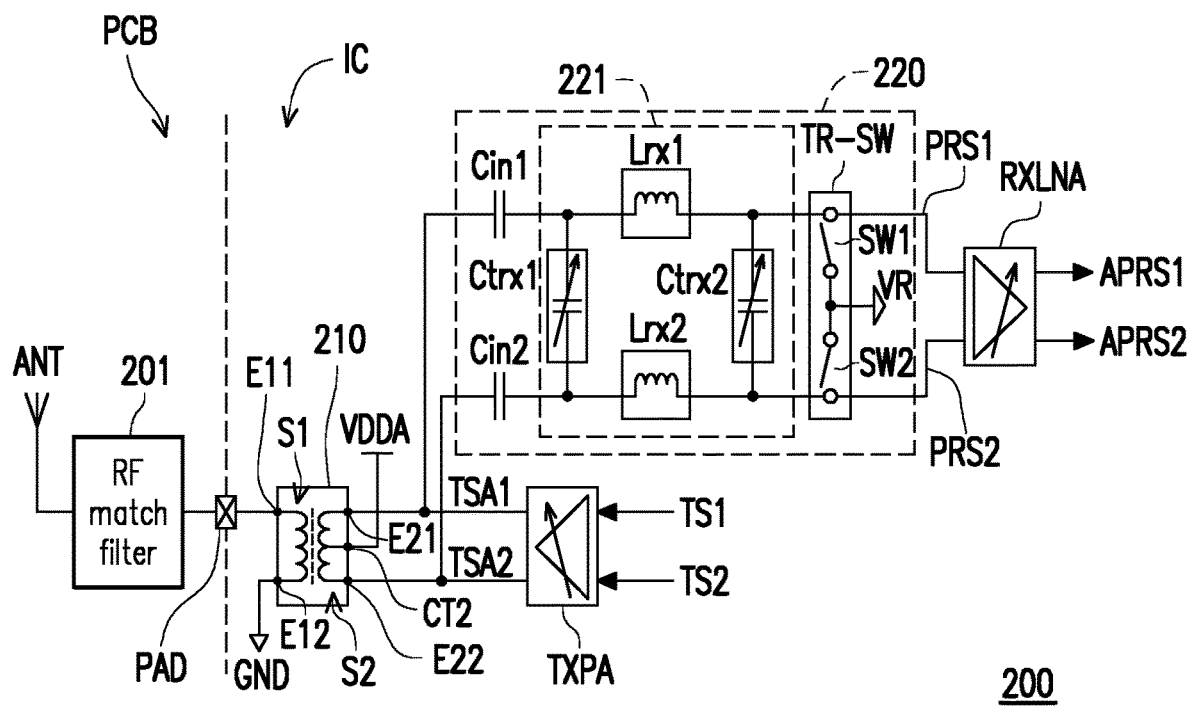
FIG. 2 is a schematic diagram illustrating an RF signal transceiver according to another embodiment of the disclosure.

With reference to FIG. 2, FIG. 2 is a schematic diagram illustrating an RF signal transceiver according to another embodiment of the disclosure. An RF signal transceiver 200 includes a transformer 210, a signal transceiving processor 220, a signal receiving amplifier RXLNA, and a signal transmitting amplifier TXPA. In this embodiment, the signal transceiving processor 220 includes a pair of direct current (DC) decoupling capacitors Cin1 and Cin2, a transmission mode switching switch TR-SW, and a capacitor inductor circuit 221. First ends of the pair of DC decoupling capacitors Cin1 and Cin2 are respectively coupled to two endpoints E21 and E22 of the secondary side S2 of the transformer 210, and second ends of the pair of DC decoupling capacitors Cin1 and Cin2 are coupled to the capacitor inductor circuit 221. The pair of DC decoupling capacitors Cin1 and Cin2 respectively filters DC levels in the signals (the pair of input differential signals RS1 and RS2) on the first end E21 and the second end E22 and transmits alternating current (AC) levels in the pair of input differential signals RS1 and RS2 to the capacitor inductor circuit 221. Through the pair of DC decoupling capacitors Cin1 and Cin2, the capacitor inductor circuit 221, the transmission mode switching switch TR-SW, and the signal receiving amplifier RXLNA do not have to operate at a high voltage level. In this way, power consumption is effectively reduced, and breakdown of high-frequency low-voltage devices is prevented in the signal receiving amplifier RXLNA.

The capacitor inductor circuit 221 includes inductors Lrx1 and Lrx2 and capacitors Ctrx1 and Ctrx2. The capacitor Ctrx1 is coupled between the second ends of the pair of DC decoupling capacitors Cin1 and Cin2. A first end of the inductor Lrx1 is coupled to a first end of the capacitor Ctrx1. A first end of the inductor Lrx2 is coupled to a second end of the capacitor Ctrx1. A second end of the inductor Lrx1 is coupled to a first end of the capacitor Ctrx2. A second end of the inductor Lrx2 is coupled to a second end of the capacitor Ctrx2. The two ends of the capacitor Ctrx2 are further coupled to the transmission mode switching switch TR-SW.

Two endpoints of the capacitor Ctrx2 (also named two transmission endpoints) coupled to the transmission mode switching switch TR-SW are further coupled to two input ends of the signal receiving amplifier RXLNA. The two endpoints of the capacitor Ctrx2 coupled to the transmission mode switching switch TR-SW provide the pair of processed differential signals PRS1 and PRS2 to the signal receiving amplifier RXLNA. The transmission mode switching switch TR-SW is turned on in the signal transmitting mode, so that the two ends of the capacitor Ctrx2 are short-circuited to a reference voltage end VR. In contrast, the transmission mode switching switch TR-SW is turned off in the signal receiving mode, so that the reference voltage end VR is disconnected from the capacitor Ctrx2 and the signal receiving amplifier RXLNA.

To be specific, in the signal transmitting mode, the transmission mode switching switch TR-SW sets the two ends of the capacitor Ctrx2 to be short-circuited to the reference voltage end VR together and sets the two input ends of the signal receiving amplifier RXLNA to receive input voltages of the same level (equal to the voltage level on the reference voltage end VR). The reference voltage end VR may be, for example, a reference ground end, so a voltage thereof is a reference ground voltage (e.g., 0 volt). Nevertheless, the disclosure is not limited thereto, and the voltage of the reference voltage end may also be other suitable values. In this case, the signal receiving amplifier RXLNA does not need to operate. Moreover, a signal transmitted by the signal transmitting amplifier TXPA is effectively attenuated in the signal transceiving processor 220, so that breakdown of the high-frequency low-voltage devices are prevented in the signal receiving amplifier RXLNA.

In contrast, in the signal receiving mode, the transmission mode switching switch TR-SW sets the two transmission endpoints and the reference voltage end VR to be disconnected. In this case, the pair of processed differential signals PRS1 and PRS2 may be smoothly transmitted to the two input ends of the signal receiving amplifier RXLNA, and the pair of amplified differential signals APRS1 and APRS2 is effectively generated. In the signal receiving mode, the signal transmitting amplifier TXPA is turned off, the output end of the signal transmitting amplifier TXPA presents high impedance.

To be specific, the transmission mode switching switch TR-SW may be formed by two switches SW1 and SW2. The switch SW1 is coupled between the first end of the capacitor Ctrx2 and the reference voltage end VR. The switch SW2 is coupled between reference voltage end VR and the second end of the capacitor Ctrx2. The switches SW1 and SW2 may be turned on or turned off according to whether the RF signal transceiver 200 operates in the signal receiving mode or in the signal transmitting mode.

In this embodiment, the capacitors Ctrx1 and Ctrx2 are programmable variable capacitors. In the signal receiving mode, capacitance of the capacitors Ctrx1 and Ctrx2 may be changed, together with input impedance of the inductors Lrx1 and Lrx2 and the signal receiving amplifier RXLNA, where the transmission mode switching switch TR-SW is set off, the match operation of the input frequency band of the signal receiving amplifier RXLNA is executed. In the signal transmitting mode, the capacitance of the capacitors Ctrx1 and Ctrx2 may be changed, together with output impedance of the inductors Lrx1 and Lrx2 and the signal receiving amplifier RXLNA, where the transmission mode switching switch TR-SW is set on, the match operation of the output frequency band of the signal transmitting amplifier TXPA is executed.

The difference between the embodiment of FIG. 1 and the embodiment of FIG. 2 is that an RF match filter 201 may be disposed between the antenna ANT and the transformer 210 in FIG. 2. The RF match filter 201 is coupled to the antenna ANT and is coupled to the first end E11 of the primary side S1 of the transformer 210. Further, a central tap end CT2 of the secondary side S2 of the transformer 210 may be connected to a power source voltage VDDA.

Note that in this embodiment, the signal receiving amplifier RXLNA may be a variable-gain low-noise amplifier, and the signal transmitting amplifier TXPA may be a variable-gain amplifier. In addition, the capacitance of the capacitor Ctrx1 and the capacitance of the capacitor Ctrx2 may be identical, and inductance of the inductor Lrx1 and the inductance of the inductor Lrx2 may also be identical. In addition, a voltage conversion ratio between the primary side S1 and the secondary side S2 of the transformer 210 may be n:1, and n may be any real number.

The RF signal transceiver 200 of this embodiment may be disposed in an integrated circuit chip IC, and the antenna ANT and the RF match filter 201 may be disposed on a printed circuit board PCB. The RF signal transceiver 200 and the RF match filter 201 may be coupled to each other through a soldering pad PAD on the chip IC.

Figure 3:
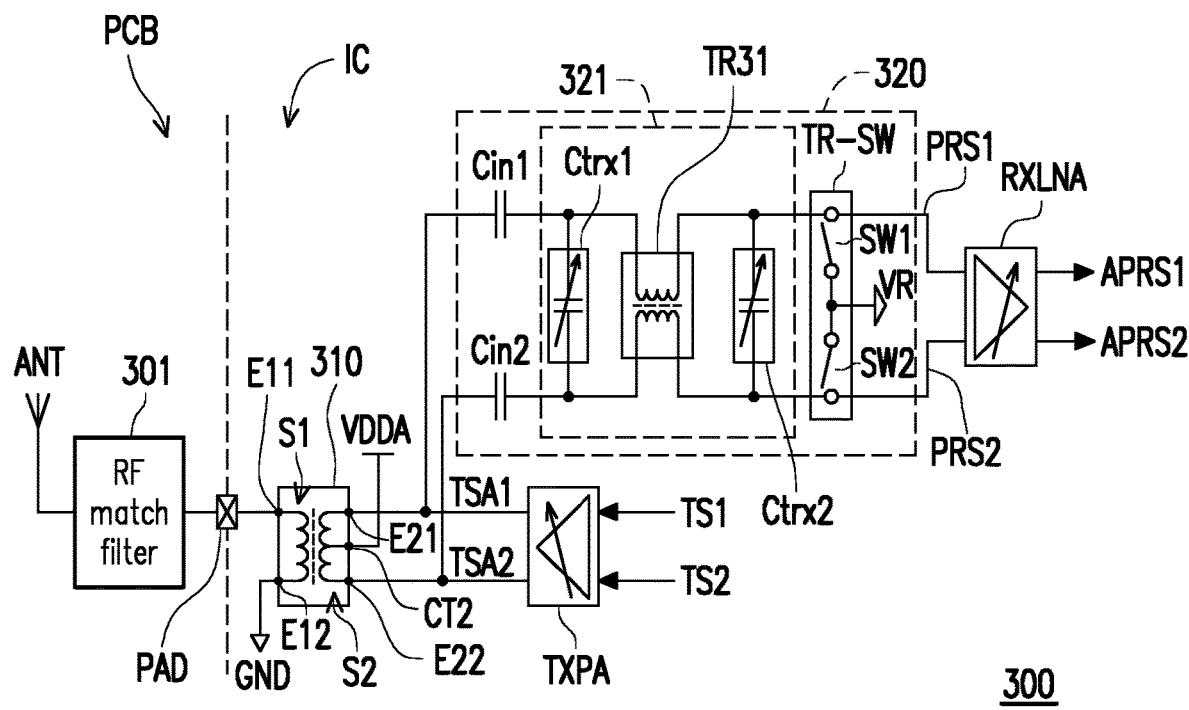
FIG. 3 is a schematic diagram illustrating an RF signal transceiver according to yet another embodiment of the disclosure.

With reference to FIG. 3, FIG. 3 is a schematic diagram illustrating an RF signal transceiver according to yet another embodiment of the disclosure. An RF signal transceiver 300 includes a transformer 310, a signal transceiving processor 320, a signal receiving amplifier RXLNA, and a signal transmitting amplifier TXPA. The primary side S1 of the transformer 310 is coupled to the antenna ANT through a RF match filter 301.

The difference between the embodiment of FIG. 2 and the embodiment of FIG. 3 is that the function of an inductor in a capacitor inductor circuit 321 included in the signal transceiving processor 320 is provided by a transformer TR31 in FIG. 3. By using the transformer TR31 instead of the inductor, a circuit layout area of the RF signal transceiver 300 is reduced, and product costs are lowered. In this embodiment, the voltage conversion ratio of the transformer TR31 may be 1:1.

Figure 4:
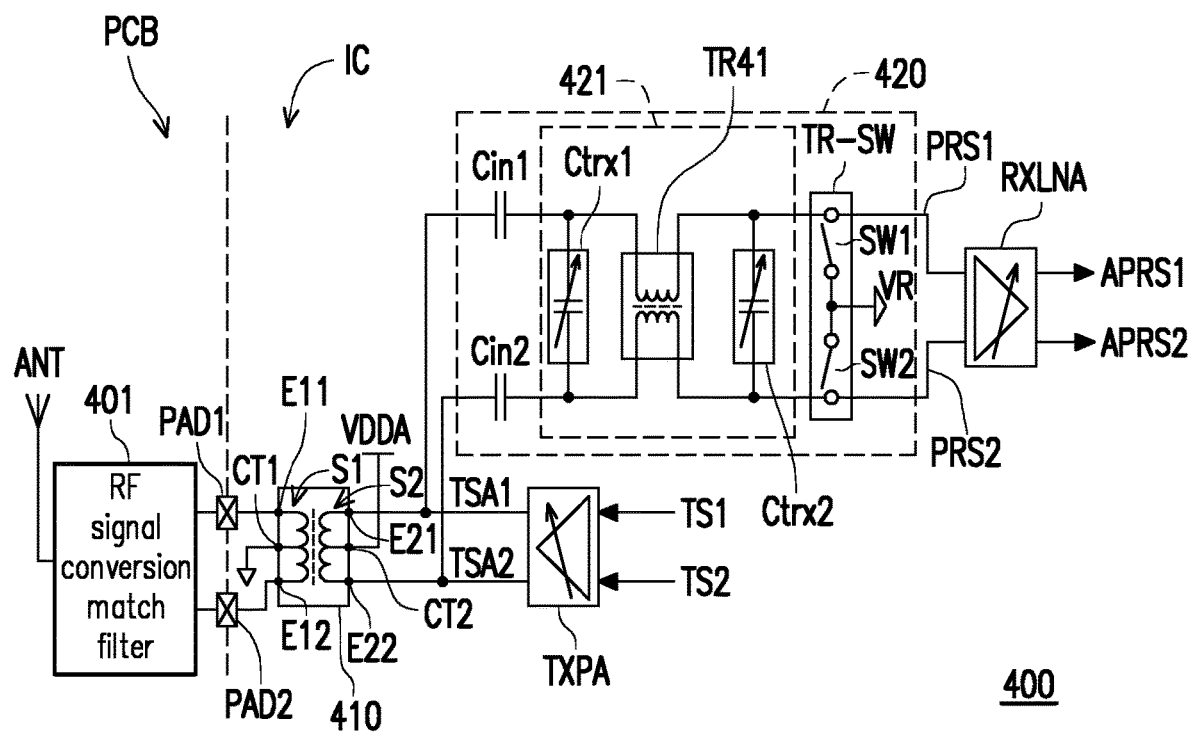
FIG. 4 is a schematic diagram illustrating an RF signal transceiver according to still another embodiment of the disclosure.

With reference to FIG. 4, FIG. 4 is a schematic diagram illustrating an RF signal transceiver according to still another embodiment of the disclosure. An RF signal transceiver 400 includes a transformer 410, a signal transceiving processor 420, a signal receiving amplifier RXLNA, and a signal transmitting amplifier TXPA. The signal transceiving processor 420 includes a pair of DC decoupling capacitors Cin1 and Cin2, a transmission mode switching switch TR- SW, and a capacitor inductor circuit 421, and the capacitor inductor circuit 421 includes the capacitors Ctrx1 and Ctrx2 and a transformer TR41.

The difference between the embodiments of FIG. 2 and FIG. 3 and the embodiment of FIG. 4 is that the two ends E11 and E12 of the primary side S1 of the transformer 410 are coupled to one side of a RF signal conversion match filter 401 respectively through soldering pads PAD1 and PAD2 of a chip IC in the RF signal transceiver 400 in FIG. 4. The other side of the RF signal conversion match filter 401 is coupled to the antenna ANT. In this embodiment, format conversion of a single-ended signal on the antenna ANT and the pair of differential signals on the RF signal transceiver 400 is performed through the RF signal conversion match filter 401. The RF signal conversion match filter 401 and the antenna ANT may be disposed on the printed circuit board PCB together.

In addition, a central tap end CT1 of a primary side S1 of the transformer 410 may be coupled to a reference ground end GND of the chip IC. In this way, common mode noise and spurs from the chip IC and the printed circuit board PCB may be effectively eliminated due to input and output (between the printed circuit board PCB and the chip IC) of fully differential signals implemented by the disclosure. The soldering pads PAD1 and PAD2 having low parasitic capacitance may still be disposed on the chip IC without an electrostatic discharge (ESD) protection assembly and features a great frequency bandwidth. Therefore, wide frequency band matching may be easily implemented, and the performance of the RF signal transceiver 400 is improved. In addition, through the center tap end CT1 of the reference ground end GND on the chip IC, low impedance is provided between the soldering pads PAD1 and PAD2 and the reference ground end GND, and favorable ESD protection is thereby provided.

In view of the foregoing, in the disclosure, the RF signal transceiver is set to be a fully differential structure through voltage conversion performed by the transformer. In this way, power consumption is effectively reduced, signal receiving and transmitting quality is improved, and noise interference resistance is enhanced. Therefore, wide frequency band matching may be easily implemented, favorable ESD protection is provided, and circuit costs are effectively reduced.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A radio frequency signal transceiver, comprising:
a first transformer, coupled to an antenna through a first end of a primary side of the first transformer, two endpoints of a secondary side of the first transformer receiving and transmitting a pair of differential signals;
a signal transceiving processor, receiving a pair of input differential signals of the secondary side of the first transformer, generating a pair of processed differential signals, wherein the signal transceiving processor comprises a transmission mode switching switch, coupled to two transmission endpoints transmitting the pair of processed differential signals, the transmission mode switching switch sets the two transmission endpoints to be short-circuited to a reference voltage end in a signal transmitting mode, and the transmission mode switching switch sets the two transmission endpoints to be disconnected from the reference voltage end in a signal receiving mode;
a signal receiving amplifier, coupled to the signal transceiving processor, configured to receive and amplify the pair of processed differential signals; and
a signal transmitting amplifier, coupled to the secondary side of the first transformer, providing a pair of transmission differential signals to the secondary side of the first transformer.

2. The radio frequency signal transceiver according to claim 1, wherein the signal transceiving processor is configured to execute a match operation of an input frequency band of the signal receiving amplifier and a match operation of an output frequency band of the signal transmitting amplifier.

3. The radio frequency signal transceiver according to claim 1, wherein the signal transceiving processor comprises:
a pair of direct current decoupling capacitors, respectively coupled to the two endpoints of the secondary side of the first transformer; and
a capacitor inductor circuit, coupled to the pair of direct current decoupling capacitors, receiving the pair of input differential signals through the pair of direct current decoupling capacitors and generating the pair of processed differential signals.

4. The radio frequency signal transceiver according to claim 3, wherein the capacitor inductor circuit comprises:
a first capacitor, coupled between the pair of direct current decoupling capacitors;
a first inductor, having a first end coupled to a first end of the first capacitor;
a second inductor, having a first end coupled to a second end of the first capacitor; and
a second capacitor, coupled between a second end of the first inductor and a second end of the second inductor,
wherein the second end of the first inductor and the second end of the second inductor provide the pair of processed differential signals.

5. The radio frequency signal transceiver according to claim 4, wherein the first capacitor and the second capacitor are variable capacitors.

6. The radio frequency signal transceiver according to claim 4, wherein the first inductor and the second inductor form a second transformer.

7. The radio frequency signal transceiver according to claim 3, wherein the capacitor inductor circuit is configured to execute a match operation of an input frequency band of the signal receiving amplifier and a match operation of an output frequency band of the signal transmitting amplifier.

8. The radio frequency signal transceiver according to claim 1, wherein a second end of the primary side of the first transformer is coupled to a reference ground end.

9. The radio frequency signal transceiver according to claim 1, where a central tap end of the secondary side of the first transformer is coupled to a power source voltage.

10. The radio frequency signal transceiver according to claim 1, wherein the first end and a second end of the primary side of the first transformer receive and transmit the pair of differential signals from the antenna, and a central tap end of the primary side of the first transformer is coupled to a reference ground end.

* * * * *